US006479885B2

(12) United States Patent
Buchanan et al.

(10) Patent No.: US 6,479,885 B2
(45) Date of Patent: Nov. 12, 2002

(54) HIGH VOLTAGE DEVICE AND METHOD

(75) Inventors: Walter R. Buchanan, Olathe, KS (US); Roman J. Hamerski, Olathe, KS (US)

(73) Assignee: Fabtech, Inc., Lee's Summit, MO (US)

( * ) Notice: Subject to any disclaimer, the term of this patent is extended or adjusted under 35 U.S.C. 154(b) by 0 days.

(21) Appl. No.: 10/108,826

(22) Filed: Mar. 28, 2002

(65) Prior Publication Data

US 2002/0098632 A1 Jul. 25, 2002

Related U.S. Application Data

(62) Division of application No. 09/670,232, filed on Sep. 28, 2000, now Pat. No. 6,376,346.

(51) Int. Cl.[7] ........................ H01L 31/036; H01L 29/06; H01L 31/0352; H01L 21/22; H01L 21/38

(52) U.S. Cl. ......................... 257/653; 257/51; 438/558; 438/489; 438/537; 438/540; 438/541

(58) Field of Search ........................... 257/51, 104–106, 257/653, 654, 655–657, 594; 438/558, 489, 537, 540, 541

(56) References Cited

U.S. PATENT DOCUMENTS

| | | | | |
|---|---|---|---|---|
| 4,959,699 A | * | 9/1990 | Lidow et al. | 357/23.7 |
| 4,982,245 A | * | 1/1991 | Hanaoka et al. | 29/480 |
| 5,252,514 A | | 10/1993 | Schüppert | 438/31 |
| 5,275,689 A | | 1/1994 | Felten et al. | 216/87 |
| 5,385,631 A | | 1/1995 | Tamemasa et al. | 216/20 |
| 5,432,360 A | * | 7/1995 | Kim et al. | 257/104 |
| 5,520,986 A | | 5/1996 | Wang | 428/131 |
| 5,635,334 A | | 6/1997 | Borland et al. | 430/311 |
| 5,654,354 A | | 8/1997 | Felten et al. | 524/147 |
| 6,013,566 A | | 1/2000 | Thakur et al. | 438/513 |
| 6,160,306 A | * | 12/2000 | Kim et al. | 257/653 |
| 6,291,328 B1 | | 9/2001 | Nobori et al. | 438/561 |

FOREIGN PATENT DOCUMENTS

JP 355050669 A * 4/1980

* cited by examiner

*Primary Examiner*—John F. Nibbling
*Assistant Examiner*—Viktor Simkovic
(74) *Attorney, Agent, or Firm*—Kyle L. Elliott; Blackwell Sanders Peper Martin, LLC

(57) ABSTRACT

An electrical device such as a diode usable in high voltage applications wherein the electrical device is fabricated from a method which yields a plurality of high voltage electrical devices, the present method including providing a substrate of a semiconductor material having a predetermined substrate conductive type, the substrate being typically formed from a monocrystalline growth method, forming a second epitaxial layer contiguous with the upper surface of the substrate, the epitaxial layer having a predetermined second layer conductive type, and thereafter forming a top layer of dopant, material in a predetermined pattern upon the upper surface of the second epitaxial layer. This predetermined pattern of dopant material typically takes the form of an array of patches which can be achieved through either a masking and etching process, or through a screen printing process. Once the predetermined pattern of dopant material is formed or otherwise deposited upon the upper surface of the epitaxial layer, the substrate, epitaxial and top layers are heated to form a diffusion region in the epitaxial layer, this diffusion region having a specific correlation to the predetermined pattern of dopant material. Once heated, the remaining top layer of dopant material is removed and the resultant substrate and diffused epitaxial layer is divided so as to form a plurality of separate electrical devices. Each patch of dopant material corresponds to the middle portion of an individual electrical device devisable from the resultant substrate and defused based and the diffusion region achieved by the heating process will be deepest substantially towards the middle portion of each respective electrical device and will be comparatively shallower at the edges of each such electrical device.

26 Claims, 2 Drawing Sheets

134 134 N+ 110 112 N- 114 P+ 130

HIGH VOLTAGE DEVICE AND METHOD

This is a divisional application of U.S. Application Ser. No. 09/670,232, now U.S. Pat. No. 6,376,346, filed Sep. 28, 2000 and issued Apr. 23, 2002.

FIELD OF THE INVENTION

This invention relates to electrical components and, more particularly, to semiconductor devices constructed to perform reliably at high voltages.

BACKGROUND

Various types of semiconductor devices are known in the art. Such devices include diodes and transistors at a relatively simple level, and complex integrated circuits and microprocessors at a relatively advanced level. Such semiconductor devices typically perform at low voltages, for example 5 Volts (V), and are therefore usually immune to problems associated with high voltages across electrical components. Accordingly, such devices have appreciable durability, dependability and performance characteristics at low voltages whereby they have come to be utilized extensively in low voltage circuits. Additionally, such semiconductor devices are relatively inexpensive to manufacture which further contributes to their desirability for commercial use.

At higher voltages, however, such devices are prone to damage and failures. For example, a diode constructed by any one of the known ways in the art and implemented in an ordinary 5V circuit may have an impeccable performance record over a significant number of years. Another diode constructed substantially identically but proportionally scaled to larger dimensions for use in a higher voltage circuit, for example 2 kilovolts (KV), and implemented therein may fail within the initial few hours of use at such high voltage. Although such failure may be due to any of the various hazards associated with the magnitude of electrical power and electrical field strengths generated at such high voltages, such failure in semiconductor components typically occurs due to the electrical fields generated by the current flowing therethrough at the edge terminations of the P/N junctions thereof. Such failure is sometimes termed as snapback in the art. Upon snapback, the operational parameters of the semiconductor component typically fall from 2KV to 0V, whereby the semiconductor component is essentially reduced to a resistor. In such event, the component, and on occasion the entire circuit, must be replaced in order to regain an operational circuit or device.

Given the reliability and success of semiconductor components in low voltage circuits of commonly used devices such as cellular phones, laptop computers, portable audio equipment, and so forth, there is a recognized need to implement similar components for performing similar tasks in higher voltage circuits of devices such as televisions and the like. Recent advancements in high definition television technology, for example, require diodes rated at 1.75KV or higher. However, diodes currently available are rated at only about 1.5KV. Some diodes are rated at 1.7KV; however, they do not provide high performance at elevated temperatures. As a result, manufacturers of such high voltage devices test for and choose the best diodes of the available 1.5KV diodes, and use them in 1.75KV applications. Expectedly, the failure rate of such diodes is higher than desirable, and furthermore the procedure of testing for the best diodes from a lot of 1.5KV diodes imposes an unnecessary additional cost upon the manufacturing process for such devices.

Accordingly, there is a need for diodes rated higher than 1.5KV, particularly diodes rated at 1.75KV or higher, which perform reliably at such high voltages, which are substantially immune from the possibility of snapback at such high voltages, which are relatively inexpensive to manufacture, and which do not need to be tested and screened for selecting only the best diodes.

The present invention is directed to overcoming one or more of the problems set forth above. These and other advantageous features of the present invention will be in part apparent and in part pointed out herein below.

SUMMARY OF THE INVENTION

In one aspect of the present invention, a plurality of electrical semiconductor components are constructed for use in high voltage applications. A substrate layer is formed by a crystalline growth method known in the art to form an ingot which is sliced to a desired thickness of the substrate layer. A second layer, preferably an epitaxial layer, is then deposited onto or formed in a surface of the substrate layer. The substrate layer in a preferred embodiment is a $P^+$ layer preferably formed from silicon material, and the epitaxial layer is an $N^-$ layer preferably formed from silicon material as well.

In a preferred embodiment, a layer containing phosphorous is deposited on the surface of the epitaxial layer. The phosphorous layer is then masked whereby preferably only the edges of individual devices to be cut therefrom remain exposed, and the exposed edges are etched away by any one of the various methods known in the art thereby leaving an array of phosphorous patches remaining at substantially the middle portions of the individual devices on their respective surfaces of the epitaxial layer. The device is then heated to a temperature preferably in the range from between 1,000° C. and 1,300° C., whereby a portion of the phosphorous material diffuses with the epitaxial layer of each individual device. The depth of the diffusion region will be deeper directly adjacent to, or beneath, each patch of phosphorous, and will be comparatively shallower at the edges thereof, that is, at the edges of each individual device. The temperature to which the device is heated and the duration thereof controls the amount of diffusion of the phosphorous into the epitaxial layer. Subsequent to the diffusion step, the remaining diffusion source patches are removed, which may be done by any conventional method or process known in the art.

By virtue of the phosphorous diffusion, a portion of the epitaxial layer of each individual device becomes a doped $N^+$-type semiconductor. The junction between the N-type epitaxial layer and the P-type conductive type substrate layer provides a P/N junction. Each individual device may then be cut away for use in an electrical circuit. During use of a device thus constructed, a majority of the flow of current occurs substantially through the middle portion of the device because of the deeper diffusion region in the middle. Comparatively, the magnitude of the electric field at the edges is lower due to the shallower diffusion region. Utilizing such a device in a high voltage application will, therefore, help minimize the possibility of snapback at the edges of the device, thereby improving the reliability and utility of such a device in high voltage applications.

In another preferred embodiment of the present invention, a $P^+$ epitaxial layer may be grown on an $N^-$ substrate layer. In this particular embodiment, instead of depositing the dopant material on the epitaxial layer, a layer of the N-type dopant material, such as phosphorous, is deposited upon the opposite surface of the N-type substrate layer and the dopant material is then masked and etched to form patches as described above. Heating the devices, as again previously described, will form similar diffusion regions in the area of the respective patches. The remaining dopant material is thereafter removed and individual devices may be cut away from the remaining semiconductor.

In yet another embodiment of the present invention, instead of depositing a layer containing dopant material onto the epitaxial layer as described above, masking the dopant material layer, and etching away the exposed portions thereof, the dopant material layer is masked at the application step to achieve the desired pattern. In other words, a layer of dopant containing material is screen printed upon the epitaxial layer in an array of diffusion source patches that are substantially identical to the array of diffusion source patches remaining after the etching step described above. The remaining steps of heating, creating a diffusion layer, and removing the remaining amount of dopant containing material in the diffusion source patches may be implemented similarly as described above. This process is an improvement over the prior art and different from the previous process discussed above in that the three steps of depositing a dopant containing layer, masking the dopant containing layer, and etching the dopant containing layer are all replaced by the single step of simply screen printing a desirable pattern of dopant containing material onto the epitaxial or substrate layer as appropriate for the above embodiments.

BRIEF DESCRIPTION OF THE DRAWINGS

For a better understanding of the present invention, reference may be made to the accompanying drawings in which.

DESCRIPTION OF THE PREFERRED EMBODIMENT

Figure 1:
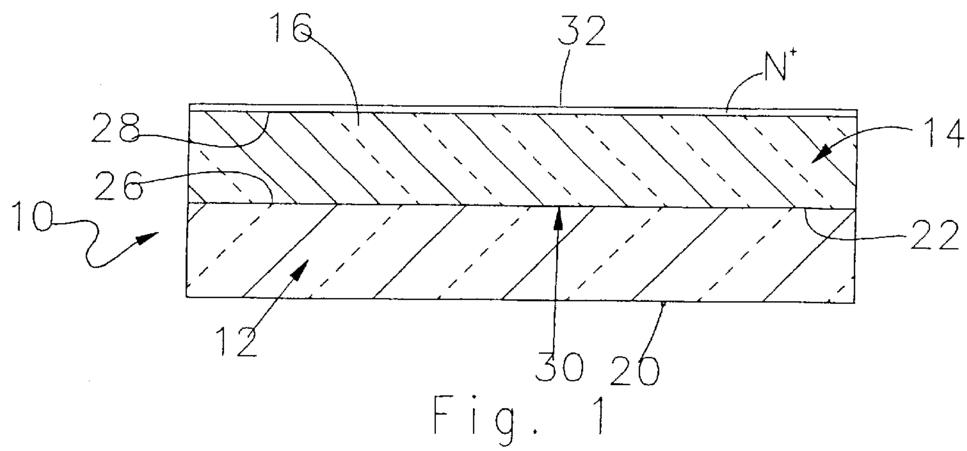
FIG. 1 is a schematic sectional view of a wafer at an intermediate step of production according to the present invention depicting a substrate layer, an epitaxial layer, and a top layer.
Figure 4:
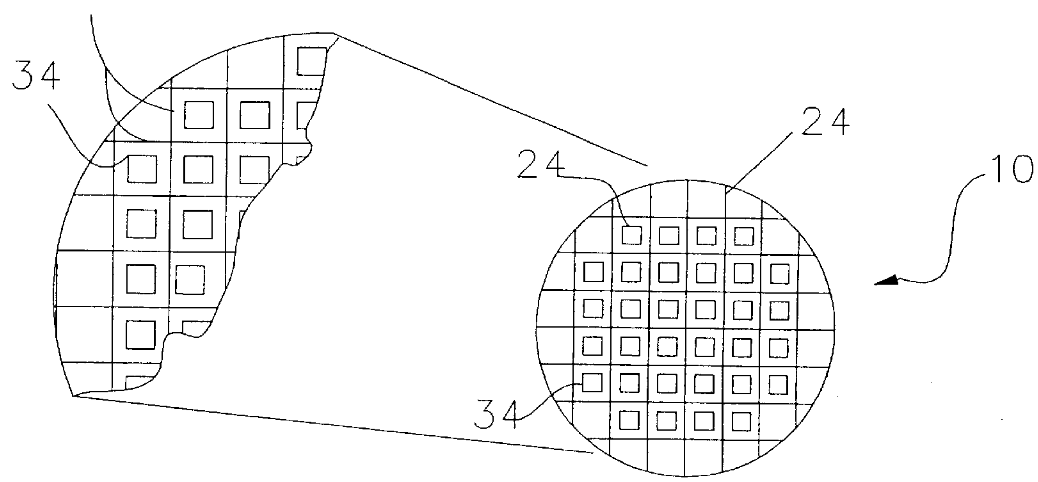
FIG. 4 is a top plan view of the wafer of FIG. 3, including a magnified view of a portion of the wafer.

Referring to the drawings, and more particularly to FIG. 1, a wafer 10 is shown at an intermediate stage of fabrication in accordance with one embodiment of the present invention. Wafer 10 generally includes a low resistivity, monocrystalline grown substrate layer 12, a high resistivity epitaxial second layer 14, and a diffusion material top layer 16. Electrical devices are formed as part of and divided from wafer 10 (FIG. 4) including the various layers 12, 14, and 16. The substrate layer 12 is formed with a heavily doped, monocrystalline, semiconductor material by a monocrystalline growth method. In the growth method, a pool of doped liquid semiconductor material is seeded with a small crystal. As the seed is slowly drawn out of the pool, the molten silicon aligns with the lattice structure of the seed crystal to form a generally cylindrical ingot of semiconductor material, which material is silicon in the preferred embodiment. The high quality semiconductor material can also be fabricated with a float zone method, which is known in the art. The cylindrically shaped ingot is then sliced into generally circular wafers 10 as depicted in FIG. 4, which at this phase of the construction process include only the substrate layer 12.

Substrate layer 12 has a first, lower surface 20 and a second, upper surface 22. The two surfaces 20 and 22 are spaced apart and substantially parallel, and they are distinguished as lower and upper surfaces only for clarity in identifying them in the orientation of the device as shown in the drawings. Substrate layer 12 has a substrate layer conductive type which is $P^+$-type in a preferred embodiment. In view of the teachings of the present invention, those skilled in the art will appreciate that the substrate layer conductive type may be of any conductive type. Thus, it is possible to have an $N^+$ conductive type substrate layer. The epitaxial layer (discussed later herein) is preferably $N^-$-type, but it could be $P^-$ for an $N^+$-type substrate. Other variations and arrangements of the layer types are also possible. The thickness of substrate layer 12 can be adjusted according to the voltage or power requirements of a particular application or embodiment of a device constructed according to the present invention.

A second layer 14, which is preferably an epitaxial layer, is formed contiguous with the upper surface 22 of substrate layer 12, and is preferably also made of silicon material. Second layer 14 is of an $N^-$ conductive type material in the preferred embodiment, at least a portion of which will be made an $N^+$-type layer as will be described later herein. Moats are formed at separation lines 24 in the wafer 10 (FIGS. 3 and 4), so that the individual devices can be defined and divided from wafer 10. Those skilled in the art will appreciate that each section or area of wafer 10 defined by the intersection of moats shall essentially form one individual device when wafer 10 is cut along moats. The thickness of second layer 14 may also be adjusted according to the voltage or electrical power requirements of a particular application or embodiment of the device. In a preferred embodiment, the thickness is approximately 130 micros in order for the devices to perform reliably at voltages of up to about 2.2KV. Second layer 14 also has a first, lower surface 26 and a second, upper surface 28, whereby lower surface 26 is substantially adjacent to upper surface 22 of substrate layer 12. The two surfaces 26 and 28 of second layer 14 are also preferably spaced apart and substantially parallel, and they are distinguished as lower and upper surfaces only for clarity in identifying them in the orientation of the device as shown in the drawings.

A top layer 16 of dopant containing material is deposited on the upper surface 28 of second layer 14. Top layer 16 will typically be comprised of a desirable dopant material for second layer 14. For example, the material of top layer 16 may contain phosphorous, arsenic, or antimony if the second layer 14 is N-type and, on the other hand, the material may contain boron if the second layer 14 is P-type. In the preferred embodiment, top layer 16 is comprised of phosphorous for the N-type second layer 14. However, it is recognized and anticipated that the material of top layer 16 may be any P or N-type dopant other than boron and phosphorous, and the dopant is selected depending on the semiconductor material used.

Figure 2:
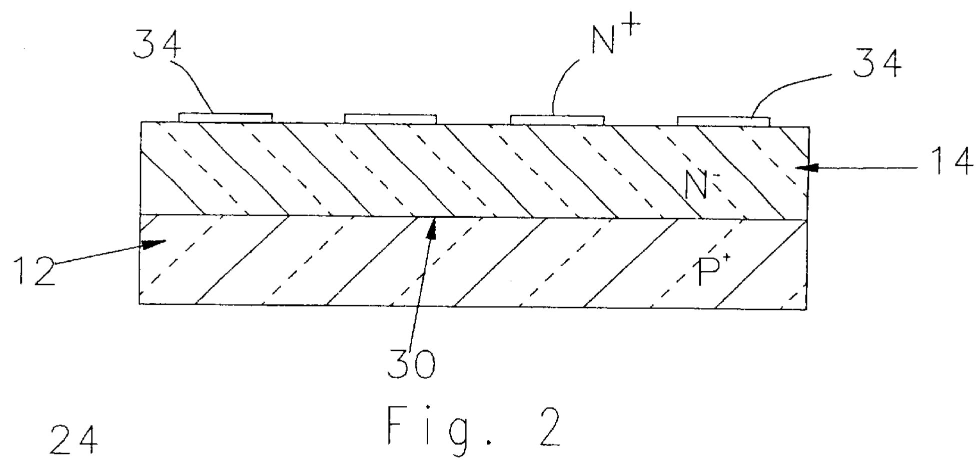
FIG. 2 is a schematic sectional view of the wafer of FIG. 1 with portions of the top layer etched away.

A mask may then be applied to an upper surface 32 of top layer 16 in order to form a predetermined pattern of dopant material. The pattern is predetermined in that the pattern is selected prior to beginning production of the devices. Masking a surface of a semiconductor device prior to an etching operation is known in the art by, for example, applying a photoresist. In the present invention, the mask preferably covers the middle portions of each individual device to be cut from wafer 10, that is, the middle portion of each area defined by the intersections of moats. Accordingly, the edge surface portions of each individual device shall remain exposed after applying the mask. After applying the mask, the exposed areas of top layer 16 are etched away by any conventional etching method known in the art. Upon completion of the etching step, an array of distinct patches 34 of the material of top layer 16 shall remain, as depicted in the side elevational view of FIG. 2. This array of patches 34 forms the predetermined pattern of dopant material and preferably each patch 34 corresponds to the middle portion of an electrical device formed as part of and divisible from the wafer 10.

Figure 3:
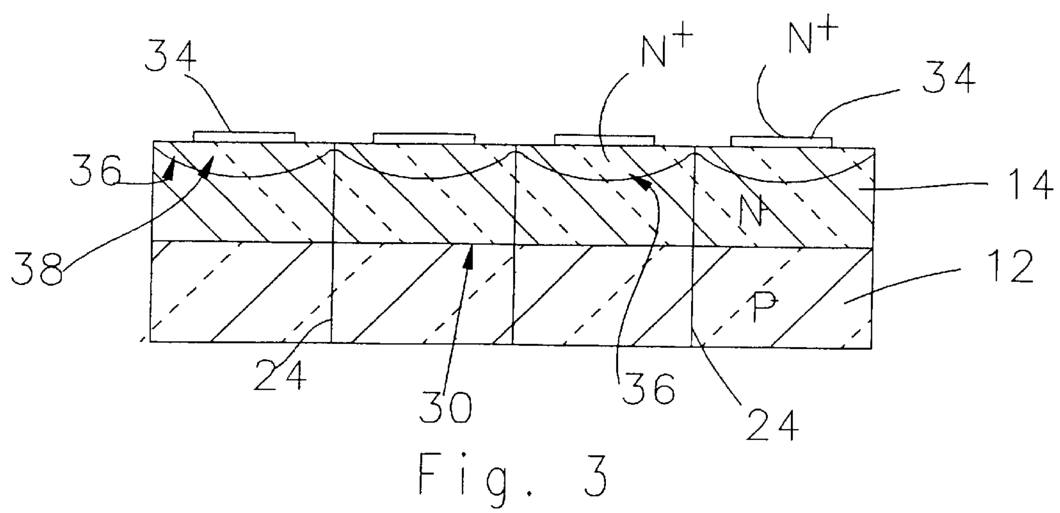
FIG. 3 is a schematic sectional view of the wafer of FIG. 2 after heating and creation of a diffusion region in the epitaxial layer.

Wafer 10 is then heated to a temperature preferably between 1,000° C. and 1,300° C. As depicted in FIG. 3, heating causes the material of patches 34 to partially diffuse into the second layer 14. Those skilled in the art will appreciate that each region of diffusion 36 shall in substantial part be immediately adjacent to a corresponding diffusion source patch 34. More particularly, each region of diffusion 36 will be the deepest in an area 38 directly below a corresponding patch 34 as shown in FIG. 3, and such regions of diffusion 36 may extend around the respective areas 38 to a comparatively smaller extent. Most significantly, and as mentioned above, the depth of the regions of diffusion 36 shall be the deepest directly beneath the patches 34. As a result, the shape of the diffusion regions 36 have a direct correlation to the predetermined pattern of dopant material, namely, the array of dopant patches 34. Further, those skilled in the art will appreciate that the depth of the diffusion regions 36 will be a function of the length of time and the temperature at which wafer 10 is heated. Ideally, each diffusion region 36 should be of a maximum depth in the middle area 38, and each region 36 will have a depth at the edges that is a fraction, approximately ½, of the depth in the middle area in order to prevent the likelihood of snapback during use of the electrical devices at high voltages. The depth at the edges is dependent on the partial pressure of the dopant coming from the patches and the dopant present in the surrounding ambient atmosphere. To control the depth of the diffusion at the edges, dopant material can be added to the ambient atmosphere during diffusion. Additionally, the edge diffusion depth is controlled by the flow rate of gases through the diffusion chamber. Accordingly, the gas flow, gas contents, temperature, and duration of heating may be adjusted to achieve a desirable balance between the depth of a desirable diffusion region 36 in area 38 of each electrical device and the associated depth of diffusion region 36 at the edge surfaces of that particular device.

Upon creating the diffusion regions 36, the wafer 10 may be cut along moats and individual semiconductor electrical devices may be obtained. It is recognized and anticipated that the devices may be any electrical device having semiconductor characteristics used in the art, such as transistors, light emitting diodes, and others, and accordingly, it is intended that the claims shall cover all such electrical devices that do not depart from the spirit and scope of the present invention. The electrical devices may then be completed and packaged or implemented in an electrical circuit by any conventional method or process known in the art. For example, after the moats are etched, the devices are passivated and then separated from each other. Additionally, switching speed is controlled by a high temperature diffusion step, which may be performed before the devices are separated from each other. Accordingly, due to the weaker electrical fields associated with the edge terminations of the transfer P/N junction, the likelihood of snapback occurring in a diode of the present invention is lower.

In an alternate embodiment of the present invention, the steps of depositing top layer 16, masking it, and etching it may be replaced by the single step of screen printing a predetermined desired pattern of the dopant material onto the upper surface 28 of second layer 14. The desired layout of the pattern of dopant material to be deposited may be determined according to the pattern of moats on wafer 10. Those skilled in the art will appreciate that the screen pattern for screen-printing the dopant material will in most part be the inverse of the pattern of the mask discussed above for the masking and etching steps. Upon screen printing the dopant material, wafer 10 may be processed as described above to complete the construction of the individual devices. Here again, the diffusion regions associated with this embodiment will again have a correlation to the particular pattern of dopant material applied to surface 28 of second layer 14. As those skilled in the art will appreciate, this embodiment is an improvement because the three steps of depositing dopant material, masking it, and etching it are replaced by the one step of simply screen printing a desired pattern of the dopant material.

Figure 6:
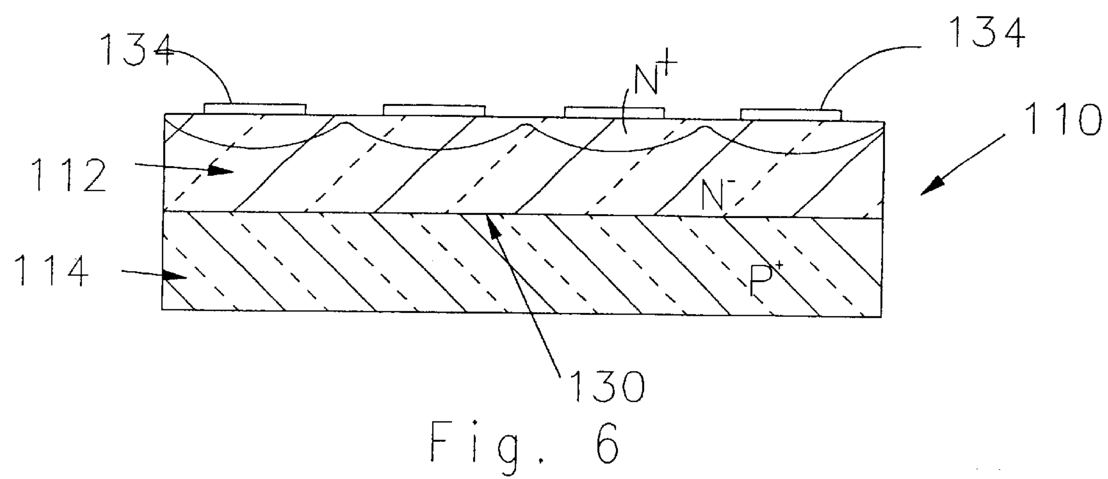
FIG. 6 is a schematic sectional view of the wafer of FIG. 5 with portions of the top layer etched away, and after heating and creation of a diffusion region in the substrate layer.
Figure 5:
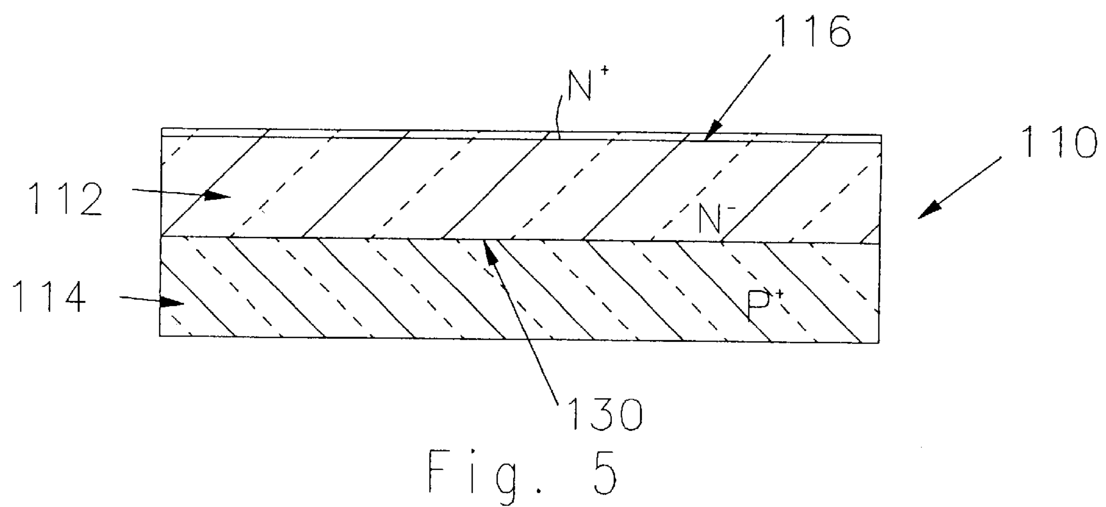
FIG. 5 is a schematic sectional view of a wafer at an intermediate step of production according to an alternate embodiment of the present invention depicting an epitaxial layer, a substrate layer, and a top layer.

In yet another embodiment of the present invention, referring to FIGS. 5 and 6, a low resistivity $P^+$ conductivity type epitaxial base layer 114 is grown on a high resistivity $N^-$ conductivity type substrate layer 112 of a wafer 110. Based on the teachings of the present invention, those skilled in the art will appreciate that a high resistivity epitaxial layer is relatively difficult and expensive to grow on a substrate layer when the epitaxial layer consists of either $N^-$-type or $P^-$-type material, particularly at greater thicknesses such as those desirable for high voltage applications. Typically, a maximum growth rate of only about 1-micron per minute may be safely achieved for growing an epitaxial layer of such material. Comparatively, an epitaxial layer of $P^+$ conductive type material may be grown on a substrate layer to a greater thickness more economically, usually at growth rates as high as 3 microns per minute or higher. A top layer 116 of dopant containing material may then be deposited upon substrate layer 112 (instead of upon the epitaxial base layer 114), and masked, etched and heated as described above to complete the diode manufacturing process in accordance with the teachings of the present invention. The base layer 114 should be thick enough to permit moats to be formed in the wafer, so that the individual devices can be defined and divided from the wafer. Alternatively, a desired pattern of top layer dopant material 116 may be screen printed upon substrate layer 112, and the remaining manufacturing steps of heating, removing diffusion source patches 134, and cutting out each individual device may be completed as discussed above. In this embodiment the material of top layer 116 is an N-type dopant material and there is a desired P/N junction 130 between the base and substrate layers. Therefore the material of top layer 116 in this preferred embodiment of the present invention is preferably phosphorous, which is an N-type dopant suitable for the N-type substrate layer 112. However, other N-type dopants can be selected. If a P-type substrate is used, the dopant would be a P-type dopant.

In this embodiment, once again the diffusion region in each device will have a correlation based upon the particular pattern of patches 134 applied to substrate layer 112 and each diffusion region will again be deeper in the middle of the electrical device and comparatively shallower at the edges thereof. Accordingly, due to the reduced thickness of the diffusion layer at the device edges and the resulting weaker electrical fields associated with the edge terminations of the transfer P/N junction in a device constructed according to this embodiment, the likelihood of snapback occurring in a diode or other electrical device will again be lower.

In view of the foregoing, it will be seen that the several objects of the invention are achieved and other advantages are attained. Although the foregoing includes a description of the best mode contemplated for carrying out the invention, various modifications are conceivable. Since it is recognized and anticipated that various changes and/or modifications could be made in the constructions and methods herein described and illustrated without departing from the spirit and scope of the present invention, it is intended that all matter contained in the foregoing description or shown in the accompanying drawings shall be interpreted as illustrative rather than limiting.

What is claimed is:

1. An electrical device usable in high voltage applications, said device being fabricated in accordance with the following steps:

providing a substrate layer having upper and lower spaced and generally parallel surfaces, said substrate layer having a predetermined substrate layer conductivity type;

forming a second layer contiguous with the upper surface of the substrate layer, said second layer having upper and lower spaced and generally parallel surfaces and a predetermined second layer conductive type thereby forming a pn junction between the substrate layer and said second layer;

forming a top layer contiguous with the upper surface of said second layer, said top layer being formed in a predetermined pattern and including a dopant material;

heating the substrate layer, second layer, and top layer to form a diffusion region in said second layer, said diffusion region having a pattern based upon the predetermined pattern of dopant material; and removing the top layer of dopant material.

2. The electrical device according to claim 1 wherein forming said second layer contiguous with the upper surface of the substrate comprises depositing an epitaxial layer onto the upper surface of said substrate.

3. The electrical device according to claim 1 wherein said substrate is formed of an $P^+$-type conductive type material.

4. The electrical device according to claim 1 wherein said second layer is formed of an $N^-$-type conductive type material.

5. The electrical device according to claim 1 wherein the dopant material is phosphorous.

6. The electrical device according to claim 1 wherein the substrate layer, second layer and top layer are heated to a temperature between about 1,000° C. and about 1,300° C.

7. The electrical device according to claim 1 wherein forming the predetermined pattern of said top layer comprises:

depositing a layer of dopant containing material on the upper surface of said second layer;

masking a surface of said layer of dopant containing material whereby certain edge surfaces thereof remain exposed; and etching the exposed edge surfaces of said layer of dopant containing material.

8. The electrical device according to claim 1 wherein forming the predetermined pattern of said top layer comprises screen printing a predetermined pattern of dopant containing material onto the upper surface of said second layer.

9. The electrical device according to claim 1 wherein the diffusion region is deepest substantially towards the middle of the electrical device and is comparatively shallower at the edges thereof.

10. A wafer divisible into a plurality of electrical devices having semiconductor properties, said wafer comprising:

a substrate layer having a substrate conductivity type;

a second layer positioned substantially adjacent to said substrate layer, said second layer having a base conductivity type whereby a pn junction exists between the substrate layer and said second layer;

an array of patches of dopant containing material deposited onto a surface of said second layer wherein each patch corresponds to an electrical device divisible from said wafer; and said second layer having a diffusion region associated with each patch of dopant containing material, the depth of said diffusion region being greatest immediately adjacent each patch of dopant containing material.

11. The wafer according to claim 10 wherein the conductivity type of said substrate is $P^+$.

12. The wafer according to claim 10 wherein the conductivity type of said base is $N^-$.

13. The wafer according to claim 10 wherein the dopant containing material comprises phosphorous.

14. An electrical device usable in high voltage applications, said device being fabricated in accordance with the following steps:

providing a substrate having upper and lower spaced and generally parallel surfaces, said substrate having a predetermined substrate conductivity type;

growing a base layer on the lower surface of the substrate, said base having upper and lower spaced apart and generally parallel surfaces and a predetermined base conductive type;

forming a top layer contiguous with the upper surface of said substrate, said top layer being formed in a predetermined pattern and including a dopant material;

heating the substrate, base and top layer to form a diffusion region in said substrate, said diffusion region having a pattern based upon the predetermined pattern of dopant material; and removing the top layer of dopant material.

15. An electrical device according to claim 14 wherein forming said base contiguous with the lower surface of the substrate comprises depositing an epitaxial layer onto the lower surface of said substrate.

16. The electrical device according to claim 14 wherein said substrate is formed of an $N^-$-type conductive type material.

17. The electrical device according to claim 14 wherein said base is formed of a $P^+$-type conductive type material.

18. The electrical device according to claim 14 wherein the dopant material is phosphorous.

19. The electrical dee according to claim 14 wherein the substrate, base and top layer are heated to a temperature between about 1,000° C. and about 1,300° C.

20. The electrical device according to claim 14 wherein forming the predetermined pattern of said top layer comprises:

depositing a layer of dopant containing material on the upper surface of said substrate;

masking a surface of said layer of dopant containing material whereby certain edge surfaces thereof remain exposed; and etching the exposed edge surfaces of said layer of dopant containing material.

21. The electrical device according to claim 14 wherein forming the predetermined pattern of said top layer comprises screen printing a predetermined pattern of dopant containing material onto the upper surface of said substrate.

22. The electrical device according to claim 14 wherein the diffusion region is deepest substantially towards the middle portion of the electrical device and is comparatively shallower at the edges thereof.

23. A wafer divisible into a plurality of electrical devices having semiconductor properties, said wafer comprising:

a substrate having a substrate conductivity type;

a base layer grown on the substrate, said base having a base conductivity type whereby pn junctions exist between the substrate and said base layer; and an array of patches of dopant containing material deposited onto a surface of said substrate wherein each patch corresponds to an electrical device divisible from said wafer, said substrate having a diffusion region associated with each patch of dopant containing material, the depth of said diffusion region being greatest immediately adjacent each respective patch of dopant containing material.

24. The wafer according to claim 23 wherein the conductivity type of said substrate is N−.

25. The wafer according to claim 23 wherein the conductivity type of said base P+.

26. The wafer according to claim 23 wherein the dopant material is phosphorous.

* * * * *

UNITED STATES PATENT AND TRADEMARK OFFICE

CERTIFICATE OF CORRECTION

PATENT NO. : 6,479,885 B2
DATED : November 12, 2002
INVENTOR(S) : Walter R. Buchanan and Roman J. Hamerski It is certified that error appears in the above-identified patent and that said Letters Patent is hereby corrected as shown below:

Column 7,
Line 34, delete the word "conductivity" and insert -- conductive --.

Column 8,
Line 30, delete the word "region" and insert -- regions --.
Line 44, after "conductive type" insert the phrase -- thereby forming a pn junction between the substrate and said base layer --.
Line 57, delete the word "An" and insert -- The --.

Column 9,
Line 1, delete the word "dee" and insert the word -- device --.

Signed and Sealed this

Eighteenth Day of March, 2003

JAMES E. ROGAN
*Director of the United States Patent and Trademark Office*